(12) United States Patent
Sreekantham et al.

(10) Patent No.: US 8,592,277 B2
(45) Date of Patent: Nov. 26, 2013

(54) METHOD OF FORMING LOW RESISTANCE GATE FOR POWER MOSFET APPLICATIONS

(75) Inventors: Sreevatsa Sreekantham, Chandler, AZ (US); Ihsiu Ho, Salt Lake City, UT (US); Fred Session, Sandy, UT (US); James Kent Naylor, Kaysville, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 231 days.

(21) Appl. No.: 12/891,147

(22) Filed: Sep. 27, 2010

(65) Prior Publication Data
US 2011/0014763 A1 Jan. 20, 2011

Related U.S. Application Data

(63) Continuation of application No. 11/467,997, filed on Aug. 29, 2006, now Pat. No. 7,807,536.

(60) Provisional application No. 60/772,315, filed on Feb. 10, 2006.

(51) Int. Cl.
*H01L 21/336* (2006.01)

(52) U.S. Cl.
USPC .......... 438/270; 438/589; 438/664; 438/677; 257/E21.41; 257/E21.199

(58) Field of Classification Search
USPC ............. 438/209, 212, 268, 270, 589, 677; 257/E21.41, E21.199
See application file for complete search history.

(56) References Cited

U.S. PATENT DOCUMENTS

| | | | |
|---|---|---|---|
| 4,847,214 A | 7/1989 | Robb et al. | |
| 5,633,036 A | 5/1997 | Seebauer et al. | |
| 6,255,177 B1 | 7/2001 | Fang et al. | |
| 6,262,453 B1 | 7/2001 | Hshieh | |
| 6,281,119 B1 | 8/2001 | Tihanyi et al. | |
| 6,635,535 B2 * | 10/2003 | Hao et al. | 438/270 |
| 6,683,346 B2 | 1/2004 | Zeng | |
| 6,764,889 B2 | 7/2004 | Baliga | |
| 6,800,898 B2 | 10/2004 | Cappelani et al. | |
| 6,967,131 B2 | 11/2005 | Saenger et al. | |
| 7,005,351 B2 | 2/2006 | Henninger et al. | |
| 7,045,859 B2 * | 5/2006 | Amali et al. | 438/589 |
| 7,323,386 B2 * | 1/2008 | Yilmaz | 438/268 |

(Continued)

OTHER PUBLICATIONS

Second Office Action received from the State Intellectual Property Office of the People's Republic of China for Application No. 200780004787.7, dated Feb. 10, 2011, 21 pages total.

(Continued)

*Primary Examiner* — Mary Wilczewski
*Assistant Examiner* — Toniae Thomas

(57) ABSTRACT

A method for forming a trench gate field effect transistor includes forming, in a semiconductor region, a trench followed by forming a dielectric layer lining a sidewall and a bottom surface of the trench. The method also includes, forming a first polysilicon layer on the bottom surface of the trench. The method further includes, forming a conductive material layer on an exposed surface of the first polysilicon layer and forming a second polysilicon layer on an exposed surface of the conductive material layer. The method still further includes, performing rapid thermal processing to cause the first polysilicon layer, the second polysilicon layer and the conductive material layer to react.

25 Claims, 11 Drawing Sheets

(56) References Cited

U.S. PATENT DOCUMENTS

| | | | |
|---|---|---|---|
| 7,368,353 B2* | 5/2008 | Cao et al. | 438/270 |
| 7,504,303 B2* | 3/2009 | Yilmaz et al. | 438/270 |
| 7,544,575 B2* | 6/2009 | Adetutu et al. | 438/664 |
| 7,807,536 B2 | 10/2010 | Sreekantham et al. | |
| 7,897,462 B2* | 3/2011 | Burke et al. | 438/270 |
| 2003/0085422 A1* | 5/2003 | Amali et al. | 438/589 |
| 2004/0016963 A1 | 1/2004 | Baliga | |
| 2005/0167742 A1 | 8/2005 | Challa et al. | |
| 2006/0157779 A1 | 7/2006 | Kachi et al. | |
| 2006/0273386 A1* | 12/2006 | Yilmaz et al. | 257/330 |
| 2008/0142909 A1 | 6/2008 | Zeng | |
| 2010/0123187 A1* | 5/2010 | Burke et al. | 438/589 |
| 2010/0123193 A1* | 5/2010 | Burke et al. | 438/589 |
| 2011/0291186 A1* | 12/2011 | Yilmaz et al. | 438/589 |

OTHER PUBLICATIONS

Gambino et al., "Reaction of Ti with WSi2," J. Appl. Phys., Dec. 15, 1997, vol. 82, No. 12, pp. 6073-6077, American Institute of Physics.

Jurczak et al., "Elevated Co-Silicide for sub-100nm High Performance and RF CMOS," slide presentation for IMEC, ESSDERC'2002, Copyright 2002, 19 pages.

Mollat et al., "Stable titanium silicide formation on field oxide after BF2 ion implantation," J. Vac. Sci. Technol., B, Mar./Apr. 2001, vol. 19, No. 2, pp. 372-375, American Vacuum Society.

Ravindra, N.M. et al., "Electrical and compositional properties of TaSi2 films," pp. 1074-1079.

Woo, "Ge LATI Pre-amorphized device and Salicide Optimization," Final Report 1998-99 for Micro Project 98-174, 3 pages.

"Table 22 Thermal/Thin Filma, Gate Etch, and Doping Technology Requirements," Draft, The International Technology Roadmap for Semiconductors: 1998, 2 pages Front End Process.

International Search Report of the International Searching Authority for Application No. PCT/US07/61717 mailed on Dec. 6, 2007, 3 pages.

Written Opinion of the International Searching Authority for Application No. PCT/US07/61717, mailed on Dec. 6, 2007, 6 pages.

International Preliminary Report on Patentability of Application No. PCT/US07/61717, mailed on Aug. 21, 2008, 7 pages.

Non-Final Office Action for U.S. Appl. No. 11/467,997, mailed on Sep. 12, 2008, 7 pages.

Final Office Action for U.S. Appl. No. 11/467,997, mailed on Oct. 14, 2009, 5 pages.

Notice of Allowance for U.S. Appl. No. 11/467,997, mailed on Jun. 1, 2010, 6 pages.

Chinese Office Action for Application No. 200780004787.7, mailed on May 5, 2010, 16 pages (English translation included).

"Office action received for Chinese patent Application No. 200780004787.7, mailed on Jan. 18, 2012", 5 pages followed by 7 pages of an English translation.

"Office action received for Chinese patent Application No. 200780004787.7, mailed on May 21, 2012", 4 pages including 1 page of a concise explanation in English.

\* cited by examiner

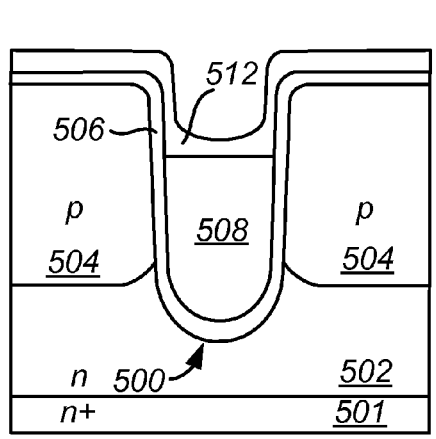
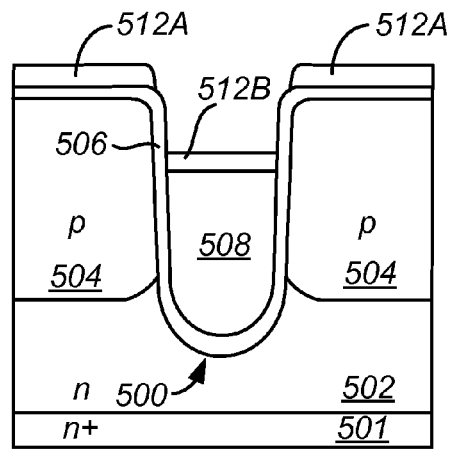
FIG. 5A  FIG. 5B
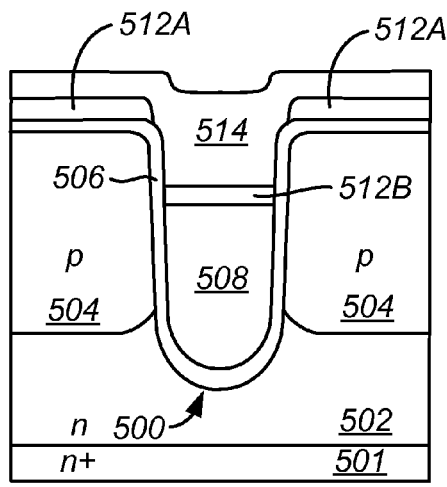
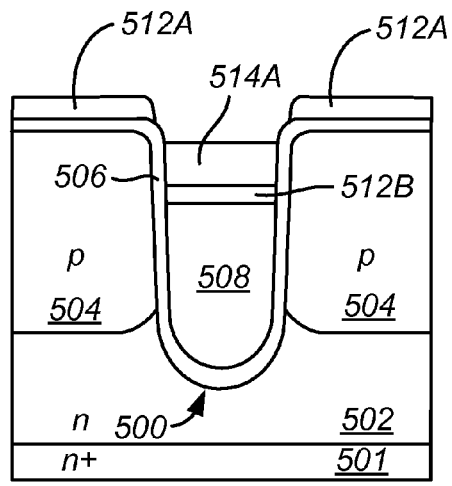
FIG. 5C  FIG. 5D
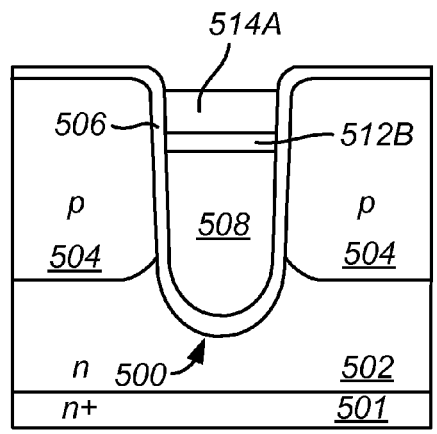
FIG. 5E

METHOD OF FORMING LOW RESISTANCE GATE FOR POWER MOSFET APPLICATIONS

CROSS-REFERENCE TO RELATED APPLICATIONS

This application is a continuation of U.S. application Ser. No. 11/467,997, filed Aug. 29, 2006, now U.S. Pat. No. 7,807,536, which claims the benefit of U.S. Provisional Application No. 60/772,315, filed Feb. 10, 2006, and is also related to the commonly assigned U.S. application Ser. No. 11/026,276, filed Dec. 29, 2004. All are incorporated herein by reference in their entirety for all purposes.

BACKGROUND

Fast switching power transistors are needed to achieve voltage conversion at a minimum power loss. Low gate impedance is critical to achieving fast switching speeds and other performance parameters in such power devices as MOSFETs. However, as the devices are scaled down, the gate line-width gets narrower and the sheet resistance contribution to the equivalent series resistance (ESR) increases, adversely affecting the switching speed.

Conventionally, the gate dopant concentration is increased to minimize the gate resistance. However, current doping concentrations are at saturation levels and any higher levels can result in dopant penetration into the channel region depending on the gate oxide integrity and the thermal budget of the process. This coupled with the continued trend of shrinking cell pitch and diminishing cross sectional area of gate electrode has resulted in a significant increase in ESR as well as potential reliability issues.

Another challenge in design of power devices, in particular trench MOSFETs, has been forming reliable and low resistance contacts to source and well regions through source contact openings (sometimes formed by recessing silicon mesa) with increasingly high aspect ratios. The limitations of the manufacturing tools and the process technology, make it difficult to form reliable and low resistance contacts through high aspect ratio source contact openings.

Therefore, there is a need for new techniques for achieving reduced gate resistance and for forming reliable and low resistance contacts through high aspect ratio source contact openings.

BRIEF SUMMARY

In accordance with one embodiment of the invention, a trench gate field effect transistor is formed as follows. A trench is formed in a semiconductor region, followed by a dielectric layer lining sidewalls and bottom of the trench and extending over mesa regions adjacent the trench. A conductive seed layer is formed in a bottom portion of the trench over the dielectric layer. A low resistance material is grown over the conductive seed layer, wherein the low resistance material is selective to the conductive seed layer.

In accordance with another embodiment of the invention, a shielded gate field effect transistor is formed as follows. A trench is formed in a semiconductor region, and then a shield dielectric lining lower sidewalls and bottom of the trench is formed. A lower portion of the trench is filled with a shield electrode. An inter-electrode dielectric is formed over the shield electrode. A dielectric layer lining upper trench sidewalls and extending over mesa regions adjacent the trench is formed. A conductive seed layer is formed over the inter-electrode dielectric layer. A low resistance material is grown over the conductive seed layer, wherein the low resistance material is selective to the conductive seed layer.

In accordance with another embodiment of the invention, a trench gate field effect transistor is formed as follows. A trench is formed in a silicon region. A first dielectric layer is formed lining the trench sidewalls but being discontinuous along the trench bottom so that a surface of the silicon region along the trench bottom is exposed. A low resistance material is grown directly over the exposed surface of the silicon region, wherein the low resistance material is selective to the exposed silicon along the trench bottom. Oxygen is implanted into the trench to thereby form a second dielectric layer between the low resistance material and the exposed silicon region along the trench bottom, such that the low resistance material is completely insulated from the silicon region by the first and second dielectric layers.

In accordance with another embodiment of the invention, a trench gate field effect transistor is formed as follows. A trench is formed in a silicon region. A dielectric layer is formed lining the trench sidewalls and bottom and extending over surfaces of the silicon region adjacent the trench. A conductive layer is formed extending along trench sidewalls and bottom and over surfaces of the silicon region adjacent the trench such that horizontally extending portions of the conductive layer are thicker than its vertically extending portions. The vertically extending portions of the conductive layer are completely removed while horizontally extending portions of the conductive layer remain including a horizontally extending portion along the trench bottom forming a conductive seed layer. A low resistance material is grown directly over the conductive seed layer, the low resistance material being highly selective to the conductive seed layer.

In accordance with another embodiment of the invention, a shielded gate field effect transistor is formed as follows. Lower sidewalls and bottom of the trench are lined with shield dielectric. A lower portion of the trench is filled with a shield electrode. An inter-electrode dielectric is formed over the shield electrode. A dielectric layer is formed lining upper trench sidewalls and extending over surfaces of the silicon region adjacent the trench. A conductive layer is formed extending along upper trench sidewalls and over the inter-electrode dielectric as well as the surfaces of the silicon region adjacent the trench such that horizontally extending portions of the conductive layer are thicker than its vertically extending portions. The vertically extending portions of the conductive layer are completely removed while horizontally extending portions of the conductive layer remain including a horizontally extending portion over the inter-electrode dielectric forming a conductive seed layer. A low resistance material is grown directly over the conductive seed layer, the low resistance material being highly selective to the conductive seed layer.

In accordance with another embodiment of the invention, a trench gate field effect transistor is formed as follows. A trench is formed in a silicon region. A dielectric layer lining the trench sidewalls and bottom is formed. A recessed polysilicon layer is formed in the trench. A highly conductive cap layer is formed over and in contact with the recessed polysilicon layer. Rapid thermal processing is performed to cause the recessed polysilicon layer and the highly conductive cap layer to react.

In accordance with another embodiment of the invention, a shielded gate field effect transistor is formed as follows. Lower sidewalls and bottom of the trench are lined with shield dielectric. A lower portion of the trench is filled with a shield electrode. An inter-electrode dielectric is formed over the shield electrode. A dielectric layer is formed lining upper trench sidewalls and extending over surfaces of the silicon region adjacent the trench. A recessed polysilicon layer is formed in the trench over the inter-electrode dielectric. A highly conductive cap layer is formed over and in contact with the recessed polysilicon layer. Rapid thermal processing is performed to cause the recessed polysilicon layer and the highly conductive cap layer to react.

In accordance with another embodiment of the invention, a trench gate field effect transistor includes a trench extending into a silicon region. A dielectric layer lines the trench sidewalls and bottom. A protective liner lines the trench sidewalls and bottom over the dielectric layer. A conductive seed layer is located in a bottom portion of the trench over the protective liner. A first layer of low resistance material extends over the conductive seed layer, wherein the protective liner protects the dielectric layer during processing steps carried out after forming the protective liner.

In accordance with another embodiment of the invention, a shielded gate field effect transistor includes a trench extending into a silicon region. A shield dielectric layer lines lower sidewalls and bottom of the trench. A shield electrode fills a lower portion of the trench. An inter-electrode dielectric extends over the shield electrode. A gate dielectric layer lines upper trench sidewalls. A protective liner lines the upper trench sidewalls over the gate dielectric layer, wherein the protective liner protects the dielectric layer during manufacturing process. A conductive seed layer recessed in the trench extends over the inter-electrode. A first layer of low resistance material extends over the conductive seed layer.

In accordance with another embodiment of the invention, a trench gate field effect transistor includes a trench extending into a silicon region. A dielectric layer lines the trench sidewalls and bottom. A conductive seed layer recessed in the trench extends over the dielectric layer. A layer of low resistance material extends over the conductive seed layer.

In accordance with another embodiment of the invention, a shielded gate field effect transistor includes a trench extending into a silicon region. A shield dielectric layer lines lower sidewalls and bottom of the trench. A shield electrode fills a lower portion of the trench. An inter-electrode dielectric layer extends over the shield electrode. A gate dielectric layer lines upper trench sidewalls. A conductive seed layer recessed in the trench extends over the inter-electrode dielectric layer. A layer of low resistance material extends over the conductive seed layer, the conductive seed layer and the layer of low resistance material forming part of a gate electrode in the trench.

In accordance with another embodiment of the invention, a trench gate field effect transistor includes a trench extending in a silicon region. A dielectric layer lines the trench sidewalls and bottom. A conductive seed layer lines trench sidewalls and bottom over the dielectric layer. A low resistance material at least partially fills the trench over the conductive seed layer.

In accordance with another embodiment of the invention, a shielded gate field effect transistor includes a trench extending in a silicon region. A shield dielectric layer lines lower sidewalls and bottom of the trench. A shield electrode fills a lower portion of the trench. An inter-electrode dielectric layer extends over the shield electrode. A gate dielectric layer lines upper trench sidewalls. A conductive seed layer lines upper trench sidewalls over the gate dielectric layer. A low resistance material at least partially fills the trench over the conductive seed layer.

In accordance with another embodiment of the invention, a field effect transistor is formed as follows. A plurality of trenches extending in a silicon region is formed. A dielectric layer lining sidewalls and bottom of each trench is formed. A recess is formed in the silicon region between every two adjacent trenches. A low resistance material is grown in each recess, wherein the low resistance material is selective to silicon such that the low resistance material grows from sidewalls of each recess inward and from bottom of each recess upward to thereby fill at least a portion of each recess.

In accordance with another embodiment of the invention, a field effect transistor is formed as follows. A plurality of trenches extending in a silicon region is formed. Lower sidewalls and bottom of each trench are lined with shield dielectric. A lower portion of each trench is formed with a shield electrode. An inter-electrode dielectric is formed over each shield electrode. A gate dielectric layer lines upper sidewalls of each trench. A gate electrode is formed in the trench over each inter-electrode dielectric. A recess is formed in the silicon region between every two adjacent trenches. A low resistance material is grown in each recess, wherein the low resistance material is selective to silicon such that the low resistance material grows from sidewalls of each recess inward and from bottom of each recess upward to thereby fill at least a portion of each recess.

A further understanding of the nature and the advantages of the invention disclosed herein may be realized by reference to the remaining portions of the specification and the attached drawings.

BRIEF DESCRIPTION OF THE DRAWINGS

FIGS. 5A-5E show simplified cross section views depicting a process sequence for forming a multi-layer trenched gate structure, in accordance with an embodiment of the invention;

DETAILED DESCRIPTION

In accordance with the present invention, various techniques for obtaining a low resistance gate in such devices a trench power MOSFETs with the flexibility to use a variety of low resistance materials and/or combinations thereof are described herein. Also, efficient methods for filling high aspect ratio features in devices are described.

Figure 1A:
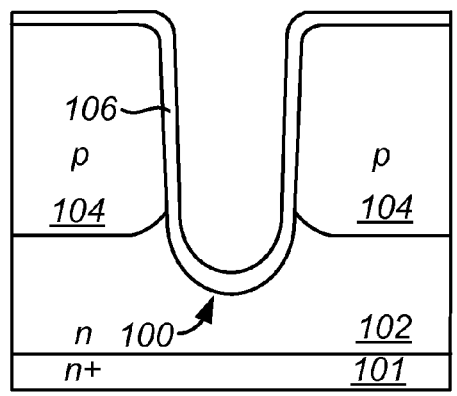
FIGS. 1A-1E show simplified cross section views at various stages of a manufacturing process for forming a trench gate MOSFET, in accordance with an exemplary embodiment of the invention.
Figure 1B:
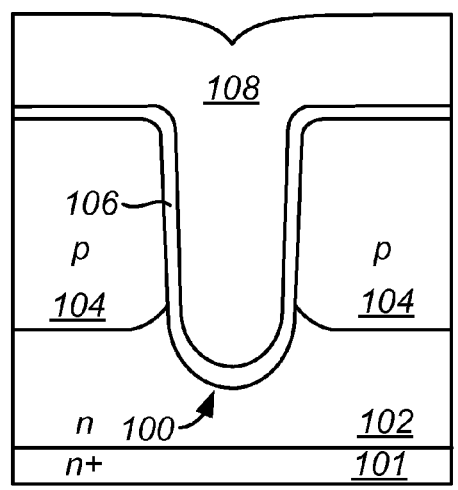
Figure 1C:
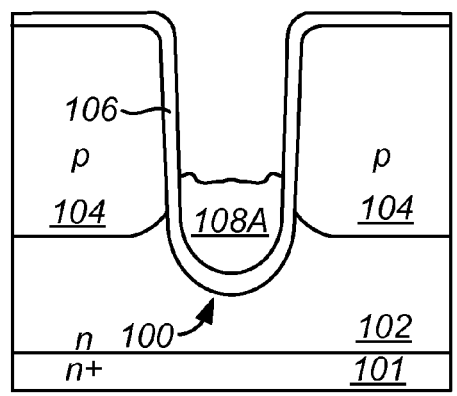

FIGS. 1A-1E show simplified cross section views at various stages of a manufacturing process for forming a trench gate MOSFET in accordance with an exemplary embodiment of the invention. In FIG. 1A, p-type well region 104, trench 100, and gate dielectric 106 lining the trench sidewalls and bottom are formed in a semiconductor region using conventional techniques. The semiconductor region includes a n-type silicon region 102 over a n+ substrate 101. Silicon region 202 may be an epitaxial layer formed over substrate 101 using convention techniques. Well region 104 extending in silicon region 102 is formed using known techniques. In FIG. 1B, a conductive layer 108 is formed filling trench 100 and extending over mesa surfaces. In FIG. 1C, conductive layer 108 is recessed to form seed layer 108A in trench 100.

Conductive materials with appropriate work function based on process integration and device requirement may be selected for conductive layer 108. In one embodiment, conductive materials with work function in the middle range of the energy band gap are used. Seed layer 108A may comprise polycrystalline or single crystalline silicon, metal or metal compound. In one embodiment, seed layer 108A is formed using the conventional methods utilized in forming n-doped or p-doped polysilicon gate electrodes in trench gate power devices. Use of polysilicon has the advantage of being compatible with existing process technologies. The polysilicon may be doped in-situ. In one embodiment, prior to forming seed layer 108A, a thick bottom dielectric (not shown) is formed along the bottom of the trench in order to minimize the gate to drain capacitance. In FIG. 1C, while seed layer 108A is recessed to a depth above the bottom surface of well region 104, the invention is not limited as such. In one embodiment, seed layer 108A is recessed to below the bottom surface of well region 104, and has a thickness in the range of 0.05-0.3 μm.

Figure 1D:
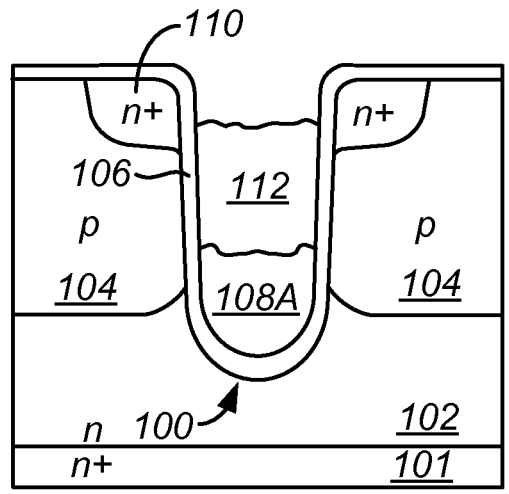

In FIG. 1D, a layer 112 of low resistance material is grown over seed layer 108A by deposition of a low resistance material that is highly selective to seed layer 108A. Thus, low resistance material 112 is formed in the trench from bottom up, and dielectric layer 106 prevents the low resistance material from forming over the mesa surfaces given the selectivity of the high resistance material to seed layer 108A. The low resistance material 112 may comprise a single material or a combination of low resistance materials including but not limited to metals, metal-silicides, metal compounds, strained Si or SiGe, or doped polysilicon. In one embodiment, seed layer 108A comprises polysilicon and the low resistance material comprises a metal silicide. The combination of materials, their structure, properties and thickness can be optimized depending on target performance and application. A number of known techniques, such as CVD, plug process or PVD, electro-plating process or a force-fill, IPVD, or directional PVD process, can be used in forming the layer(s) of low resistance material 112.

In one embodiment, the low resistance material has an upper surface at a level substantially equal to the top surface of conventional recessed gates. In one embodiment, less than or equal to 80% of the gate electrode is made up of seed layer 108A, and the remaining portion of the gate electrode is made up of one or more low resistance material. In another embodiment, the low resistance material has a thickness greater than 400 Å. Forming such thick low resistance material is made possible by the selective deposition over a suitable seed layer.

Figure 1E:
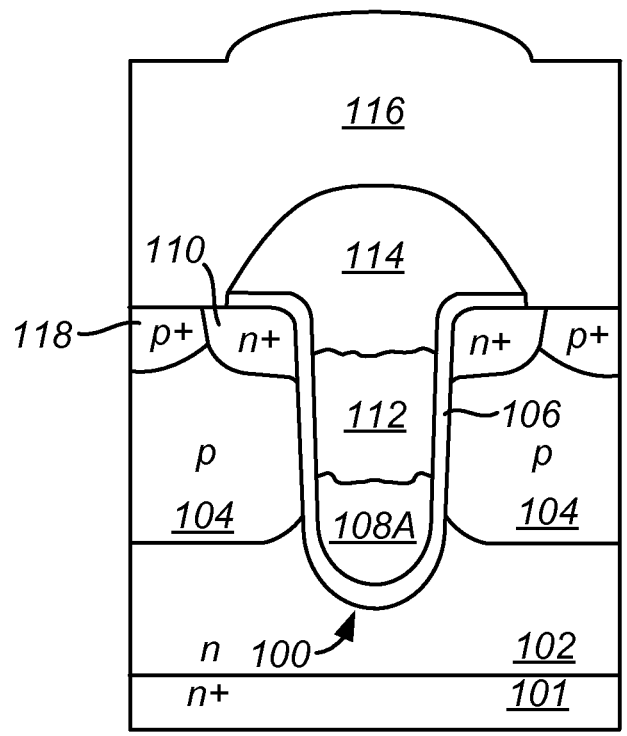

In FIG. 1E, source regions 110, dielectric cap 114, heavy body regions 118 and source metal layer 116 are formed using known techniques. While FIGS. 1A-1E show a particular sequence for forming the various layers/regions of the MOSFET, the invention is not limited as such. For example, well region 104 and source regions 110 may be formed at later or earlier stages of the process.

Figure 13A:
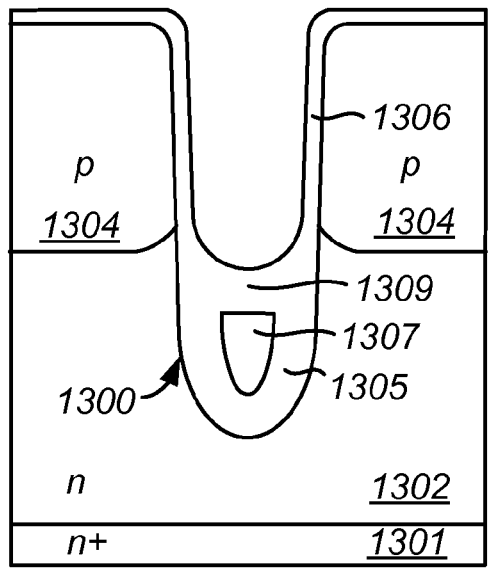
FIGS. 13A-13B are simplified cross section views depicting implementation of the seed layer technique in a shielded gate MOSFET.
Figure 13B:
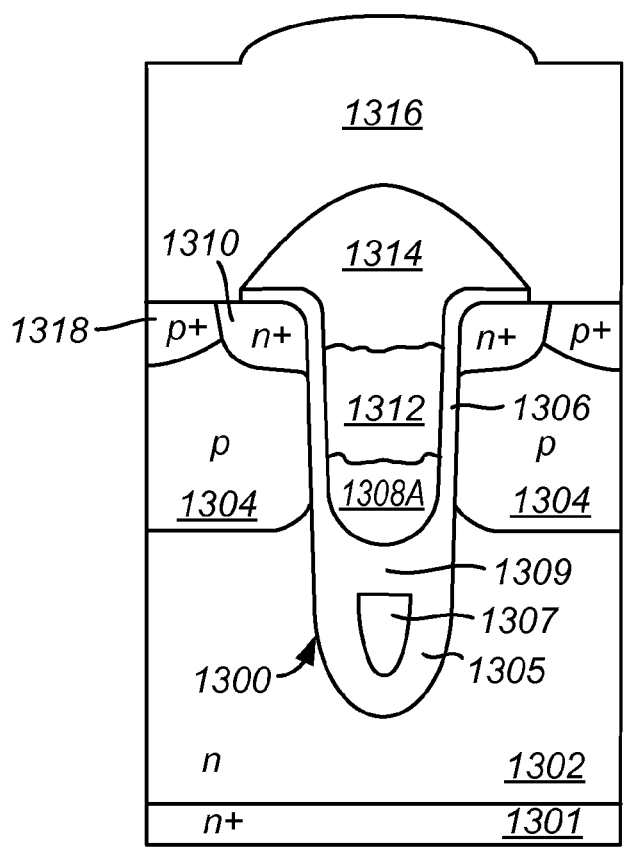

Use of a conductive seed layer and an overlying low resistance material that is selective to the conductive seed layer is not limited to trench gate FETs. This technique may be similarly implemented in other types of power devices such as trench gate IGBTs and shielded gate MOSFETs and IGBTs. As an example, implementation of the seed layer technique in a shielded gate MOSFET is briefly described next with reference to FIGS. 13A-13B. In FIG. 13A, well region 1304 and trench 1300 are formed in a semiconductor region using conventional techniques. The semiconductor region includes a n-type silicon region 1302 over a n+ substrate 1301. Silicon region 1302 may be an epitaxial layer formed over the substrate using conventional techniques. Well region 1304 extending in silicon region 1302 is formed using known techniques. A shield dielectric 1305 (e.g., comprising oxide) lining lower trench sidewalls and bottom, a shield electrode 1307 (e.g., comprising polysilicon) filling a lower portion of the trench, an inter-electrode dielectric 1309 (e.g., comprising oxide) extending over the shield electrode, and a gate dielectric 1306 (e.g., comprising oxide) lining the upper trench sidewalls and extending over the mesa between adjacent trenches are formed using conventional techniques. Shield dielectric 1305 has a greater thickness than gate dielectric 1306. In FIG. 13B, similar steps to those in FIGS. 1A-1E are then carried out to form the gate electrode 1308A, 1312 over the inter-electrode dielectric and the other layers and regions (i.e., source regions 1310, heavy body regions 1318, dielectric cap 1314, and source interconnect layer 1316) of the MOSFET.

Figure 2A:
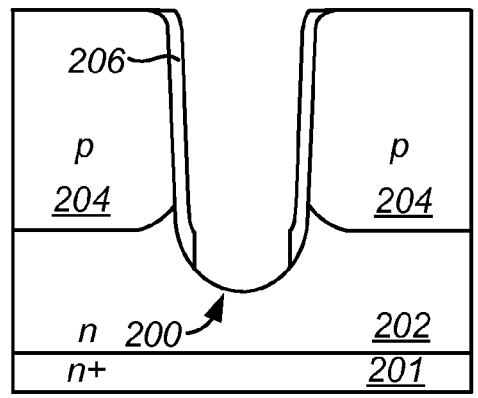
FIGS. 2A-2C show simplified cross section views depicting a process sequence for forming a trenched gate using a seed layer, in accordance with an embodiment of the invention.
Figure 2B:
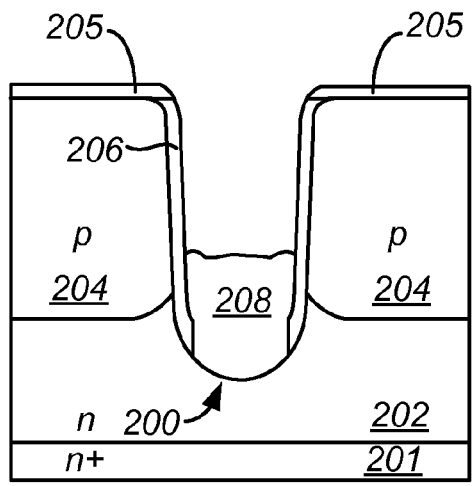
Figure 2C:
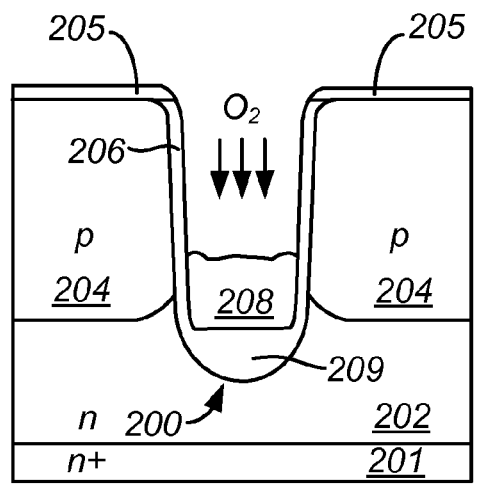

FIGS. 2A-2C show another technique for forming a seed layer in the trench, in accordance with another exemplary embodiment of the invention. In FIG. 2A, well region 204, trench 200 and a dielectric layer lining the trench sidewalls and bottom and extending over the adjacent mesa surfaces are formed in a semiconductor region using conventional techniques. The semiconductor region includes a n-type silicon region 202 over a n+ substrate 201. Silicon region 202 may be an epitaxial layer formed over the substrate using conventional techniques. Well region 204 extending in silicon region 202 is formed using known techniques. A conventional selective or directional etch of the dielectric layer is carried out to remove the horizontally extending portions of the dielectric layer, leaving vertically extending portions 206 of the dielectric layer along trench sidewalls, as shown. A surface of silicon region 202 along the bottom of trench 200 is thus exposed. In one embodiment, using known techniques, a protective layer (e.g., nitride spacers, not shown) is formed to protect the vertically extending portions 206 of the dielectric layer from the dielectric etch. The exposed silicon along the bottom of trench 200 serves as the seed layer for selective growth of a low resistance material as shown in FIG. 2B.

In FIG. 2B, with the mesa surfaces covered by a protective layer 205, a low resistance material 208 is selectively grown (using e.g., SEG) to a predetermined thickness over the exposed silicon surface at the bottom of trench 200. In one embodiment where low resistance material 208 is formed using SEG, low resistance material 208 is grown to a thickness in the range of 2,000-2,500 Å. Any of the above-noted material and techniques for forming layer 112 in FIG. 1D may be used in forming layer 208. In FIG. 2C, in order to eliminate the gate to drain electrical short present in FIG. 2B, a well-known silicon implanted oxide (SIMOX) technique is used to implant Oxygen through gate material 208 thereby forming a dielectric layer 209 along the bottom of trench 200. Similar process steps to those depicted by FIGS. 1D-1E can be carried out next to complete the transistor structure.

An alternate process sequence to that depicted by FIGS. 2A and 2B is as follows. A hard mask comprising oxide is used to define and etch trenches 200, and then an oxide layer 206 thinner than the hard mask is formed lining the trench sidewalls and bottom. A selective or directional oxide etch is carried out to remove the portion of dielectric layer 206 extending along the trench sidewalls with the vertically extending portions remaining intact (since the hard mask is thicker than oxide layer 206, the mesa remains covered by the hard mask after the etch, albeit thinner). With the mesa surfaces covered by the remaining portions of the hard mask, low resistance material 208 is selectively grown over the exposed silicon surface at the bottom of trench 200.

Yet another alternate process sequence to that depicted by FIGS. 2A and 2B is as follows. A hard mask comprising ONO composite layer is used to define and etch trenches 200, and then an oxide layer 206 lining the trench sidewalls and bottom is formed. A selective or directional oxide etch is carried out to remove the portion of dielectric layer 206 extending along the trench sidewalls with the vertically extending portions remaining intact (while the top oxide layer in the ONO may be removed during the etch, the mesa surfaces remain covered by the remaining NO layers of the ONO mask). With the mesa surfaces covered by the remaining portion of the hard mask, low resistance material 208 is selectively grown over the exposed silicon surface at the bottom of trench 200.

Figure 3A:
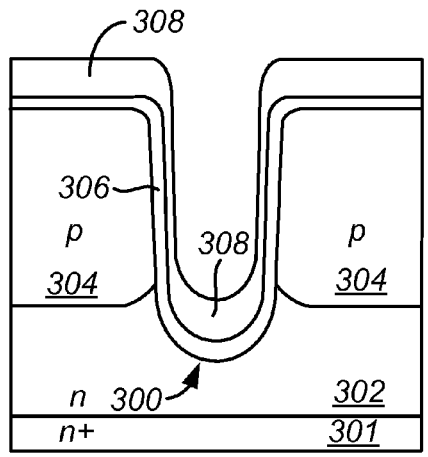
FIGS. 3A-3D show simplified cross section views depicting a process sequence for forming a trenched gate using a seed layer, in accordance with another embodiment of the invention.

FIGS. 3A-3D show simplified cross section views of another process sequence for forming a seed layer in accordance with another embodiment of the invention. In FIG. 3A, well region 304, trench 300 and dielectric layer 306 lining the trench sidewalls and bottom and extending over the adjacent mesa surfaces are formed in a semiconductor region using conventional techniques. The semiconductor region includes a n-type silicon region 302 over a n+ substrate 301. Silicon region 302 may be an epitaxial layer formed over the substrate using conventional techniques. Well region 304 extending in silicon region 302 is formed using known techniques. Note that while dielectric layer 306 appears as a single layer formed in one process step, dielectric layer 306 may be formed in multiple steps. For example, in one embodiment, the portions of dielectric layer 306 extending over the mesa surfaces form part of a hard mask used to define and etch trenches 300. After trenches 300 are formed, portions of dielectric layer 306 lining the trench sidewalls and bottom are formed. The portions of dielectric layer 306 lining the trench sidewalls and bottom would be thinner than those portions extending over the mesa regions.

Figure 3B:
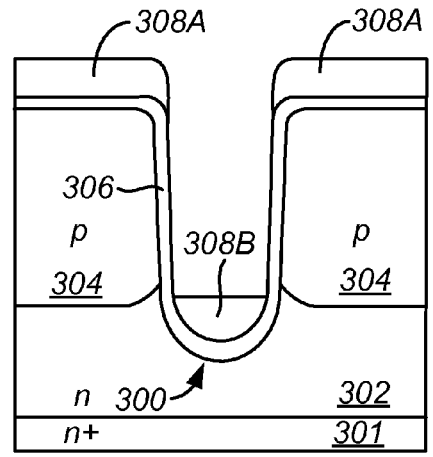

In FIG. 3A, a conductive layer 308 is then formed using a directional deposition technique such as ionized vapor deposition (IPVD), evaporation, collimation, or sputtering gas pressure variation to enhance directionality during sputtering. Higher trench aspect ratios would also promote directional growth of conductive layer 308. Directional deposition advantageously forms a layer which is thicker along the horizontal surfaces and thinner along the vertical surfaces, as shown. In one embodiment, the target thickness of conductive layer 308 over the horizontal surfaces is in the range of 1,000-2000 Å. In FIG. 3B, a conventional isotropic etch is used to remove vertically extending portions of layer 308 (i.e., portions extending along trench sidewalls) thus leaving horizontally extending portions 308A and 308B. Any of the above-identified material for seed layer 108A in FIG. 1C may also be used for seed layer 308B.

Figure 3C:
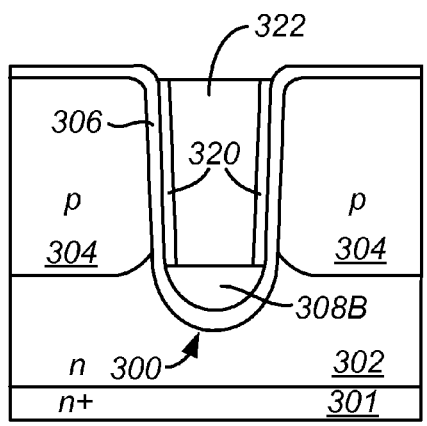

In FIG. 3C, sidewall spacers 320 (e.g., comprising silicon nitride) are formed to protect corresponding portions of dielectric layer 306, using known techniques. A removable seed blocking layer 322 (e.g., photoresist) is then formed and recessed into trench 300. With blocking layer 322 protecting seed layer 308B, conductive layer portions 308A are removed from over the mesa surfaces, as shown in FIG. 3C. One advantage of using spacers 320 is to protect dielectric 306 along the trench sidewalls given the potential wide variations in recess of protective layer 322. In one embodiment, protective layer 322 is formed using known CMP techniques, and no spacers 320 are formed prior to forming the protective layer 322.

Figure 3D:
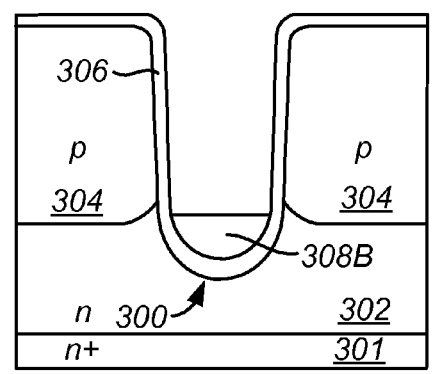

In FIG. 3D, blocking layer 322 and sidewall spacers 320 are removed, with seed layer 308B remaining in the trench. Similar process steps to those depicted by FIGS. 1D-1E can be carried out next to complete the cell structure. In one embodiment, seed layer 308B is recessed to below the bottom surface of well region 304, and has a thickness in the range of 0.05-0.3 µm. In another embodiment, prior to forming conductive layer 308, a thick bottom dielectric is formed along the trench bottom using known techniques. This helps minimize the gate to drain capacitance.

The technique depicted by FIGS. 3A-3D may be similarly implemented in other types of power devices such as trench gate IGBTs and shielded gate MOSFETs and IGBTs. As an example, implementation of the technique depicted by FIGS. 3A-3D in a shielded gate MOSFET is briefly described next. After forming trenches extending into a silicon region, a shield dielectric (e.g., comprising oxide) lining lower trench sidewalls and bottom, a shield electrode (e.g., comprising polysilicon) filling a lower portion of the trench, an inter-electrode dielectric (e.g., comprising oxide) extending over the shield electrode, and a gate dielectric (e.g., comprising oxide) lining the upper trench sidewalls and extending over the mesa between adjacent trenches are formed using conventional techniques. A Similar steps to those in FIGS. 3A-3D, starting with the step of forming conductive layer 308, are then carried out to form the gate electrode over the inter-electrode dielectric and the other layers and regions of the MOSFET.

Figure 4A:
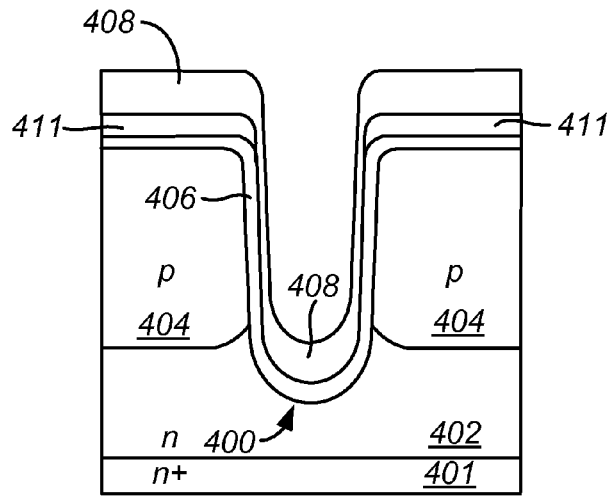
FIGS. 4A-4C show simplified cross section views depicting a process sequence for forming a trenched gate using a seed layer, in accordance with yet another embodiment of the invention.
Figure 4B:
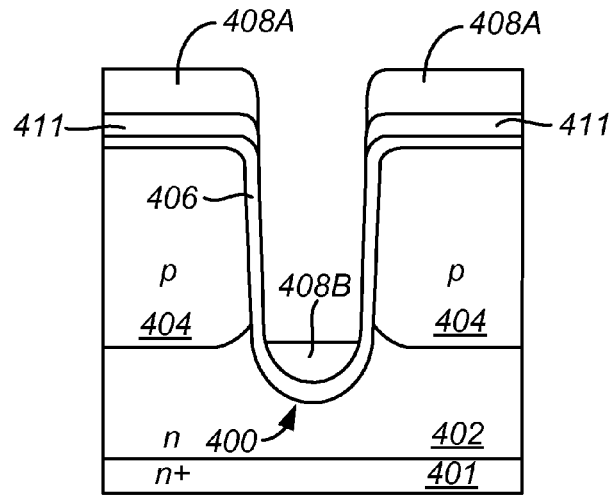
Figure 4C:
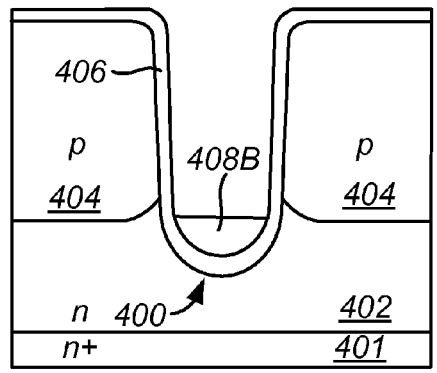

A variation of the technique in FIGS. 3A-3D is shown in FIGS. 4A-4C. As shown, well region 404, trench 400 and dielectric layer 406 lining the trench sidewalls and bottom and extending over the adjacent mesa surfaces are formed in semiconductor region 402 using conventional techniques. In FIG. 4A, similar steps to those corresponding to FIG. 3A are carried out except prior to forming conductive layer 408, a lift-off layer 411 (e.g., a hard mask such as silicon nitride) extending over the mesa surfaces is formed as shown. In FIG. 4B, an isotropic etch is used to remove vertically extending portions of seed layer 408 (i.e., portions extending along trench sidewalls) thus leaving horizontally extending portions 408A and 408B. In FIG. 4C, the lift-off layer is etched (e.g., using a wet chemical etch) which in turn results in lifting and removal of its overlying portions 408A of conductive layer 408. Because lift-off layer 411 is not present under seed layer 408B, seed layer 408B remains intact during removal of lift-off layer 411.

Similar to that described above in connection with dielectric layer 306 in the FIGS. 3A-3D embodiment, while dielectric layer 406 appears as a single layer formed in one process step, dielectric layer 406 may be formed in one or multiple steps. For example, in one embodiment, the portions of dielectric layer 406 extending over the mesa surfaces together with lift-off layer 411 form part of a hard mask used to define and etch trenches 400. After trenches 400 are formed, those portions of dielectric layer 406 lining the trench sidewalls and bottom are formed. The remaining process steps are similar to those described above in connection with FIGS. 4B and 4C.

FIGS. 5A-5E are cross section views at various stages of a process for forming a highly conductive cap layer over the gate of a trench gate field effect transistor, in accordance with an embodiment of the invention. In FIG. 5A, well region 504, trench 500, dielectric layer 506 lining the trench sidewalls and bottom and extending over the mesa surfaces, and a gate 508 recessed in trench 500 are formed in a semiconductor region using conventional techniques. The semiconductor region includes a n-type silicon region 502 over a n+ substrate 501. Silicon region 502 may be an epitaxial layer formed over the substrate using conventional techniques. Well region 504 extending in silicon region 502 is formed using known techniques. In one embodiment, gate 508 is a multi-layer structure. For example, gate 508 may be formed by first forming a polysilicon layer recessed deep into trench 500, and then forming a thin layer of a highly conductive material (e.g., metal) over the recessed polysilicon layer followed by forming another recessed polysilicon layer over the thin metal layer. The metal layer sandwiched by the two polysilicon layer is then reacted such that it is completely consumed by polysilicon from both sides.

Referring back to FIG. 5A, a conductive layer 512 comprising one or more of tungsten (W), tantalum (Ta), and molybdenum (Moly or Mo) is formed using a directional deposition technique such as ionized vapor deposition (IPVD), evaporation, collimation, or sputtering gas pressure variation to enhance directionality during sputtering. A more recessed gate than that shown in FIG. 5A can also be used to provide a higher aspect ratio opening which in turn promotes directional growth of layer 512. Accordingly, layer 512 is thicker along the horizontal surfaces and thinner along vertical surfaces.

In FIG. 5B, conductive layer 512 is isotropically etched to remove the vertically extending portions of layer 512 with horizontally extending portions 512A and 512B remaining. In FIG. 5C, a protective layer 514 (e.g., comprising polysilicon or BPSG) is formed to fill trench 500. Layer 514 is then recessed forming portion 514A inside trench 500, as shown in FIG. 5D. Portion 514A serves to protect the underlying gate material in the subsequent step. In FIG. 5E, portions 512A of the conductive layer over the mesa regions are etched, with protective layer 514A protecting its underlying gate material from the etch process. Rapid thermal processing (RTP) is then carried out to cause polysilicon 508 and conductive layer 512B to react.

In the embodiment where protective layer 514 comprises polysilicon and conductive layer 512B comprises a metal, conductive layer 512B is reacted such that it is completely consumed by polysilicon from both sides. The remainder of the structure (e.g., source regions, heavy body regions and source and drain interconnects) is formed using conventional processing techniques. As with the prior embodiments, the technique depicted by FIG. 5A may be similarly implemented in other types of power devices such as trench gate IGBTs and shielded gate MOSFETs and IGBTs.

Figure 6A:
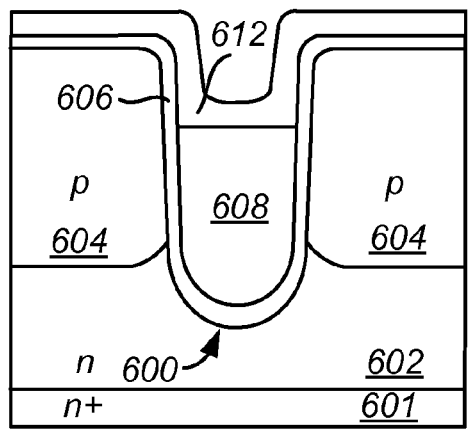
FIGS. 6A-6C show simplified cross section views depicting a process sequence for forming a multi-layer trenched gate structure, in accordance with another embodiment of the invention.
Figure 6B:
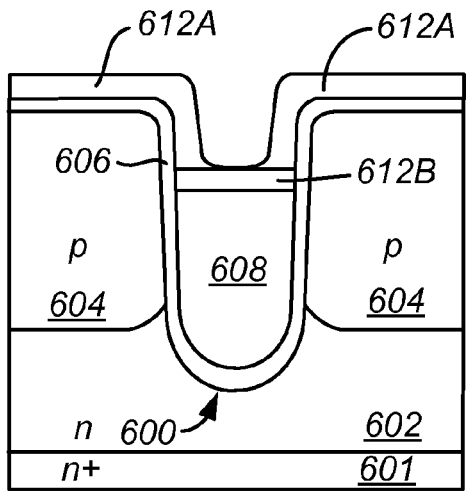
Figure 6C:
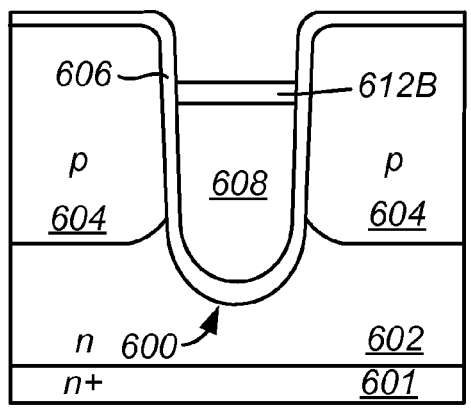

FIGS. 6A-6C show cross section views of an alternate method of forming a highly conductive cap layer over the gate, in accordance with another embodiment of the invention. In FIG. 6A, well region 604, trench 600, dielectric layer 606 lining the trench sidewalls and bottom extending over the mesa regions, and recessed gate 608 are formed in a semiconductor region using conventional techniques. The semiconductor region includes a n-type silicon region 602 over a n+ substrate 601. Silicon region 602 may be an epitaxial layer formed over the substrate using conventional techniques. Well region 604 extending in silicon region 602 is formed using known techniques. A conductive layer 612 comprising one or more salicidable material such as titanium (Ti), cobalt (Co), and Nickel (Ni) is formed using conventional techniques. In FIG. 6B, rapid thermal processing (RTP) is carried out to cause conductive layer 612 and polysilicon 608 to react to form portion 612B, while portions 612A of conductive layer 612 extending over dielectric 606 remain unchanged. In the embodiment wherein layer 612 comprises titanium, the RTP results in formation of C49 $TiSi_2$ in cross-hatched region 612B. For this embodiment, the RTP is carried out at a temperature less than about 700° C.

In FIG. 6C, the un-reacted portions 612A (e.g., Ti) are etched without removing the reacted portion 612B. In one embodiment, a wet chemical etch which is naturally selective between the reacted and un-reacted portions is used. Another rapid thermal processing is carried out to cause reacted layer 612B to go through a phase transformation to reduce its resistance. In the embodiment wherein reacted layer 612 comprises C49 $TiSi_2$, the second RTP is carried out at a temperature in the range of 800° C.-850° C. or greater thereby causing the C49 $TiSi_2$ to change phase to the lower resistance C54 $TiSi_2$. In an alternate embodiment, prior to the second RTP, a BPSG cap layer is formed over the gate structure so that the second RTP serves to not only cause the phase transformation of the reacted layer 612B, but also to reflow the BPSG cap.

Figure 7:
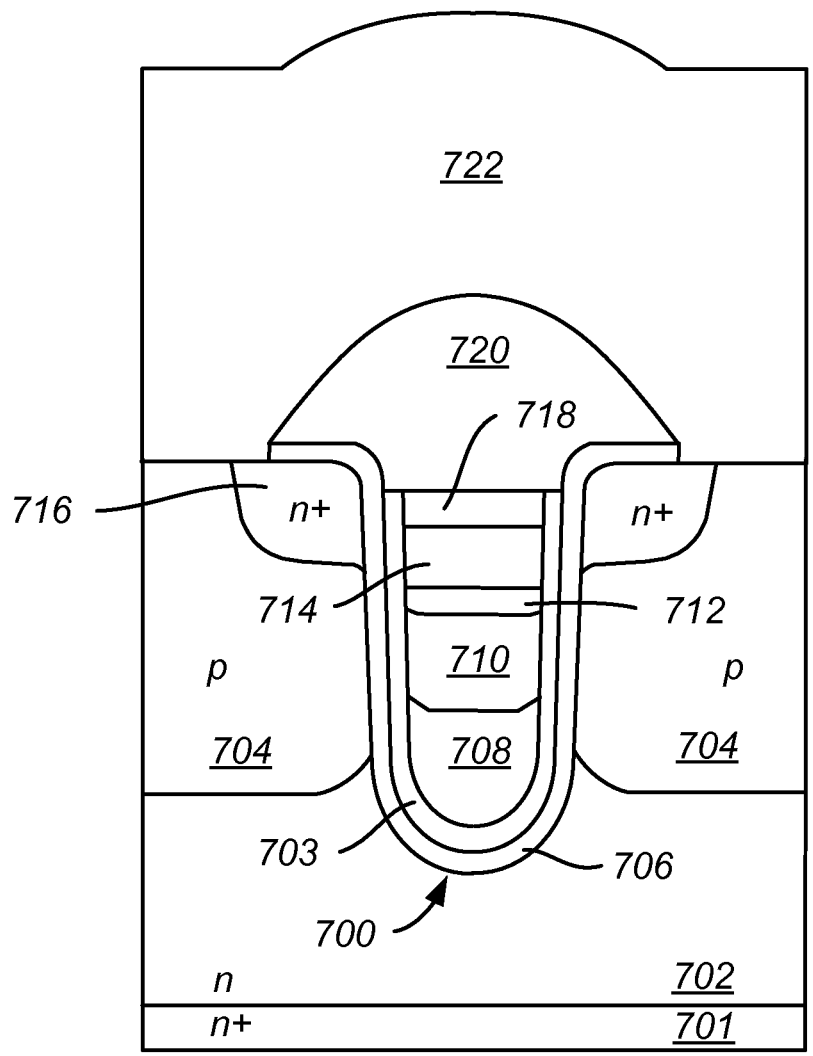
FIGS. 7-11 show cross section views of multi-layer trenched gate structures in accordance with embodiments of the invention.

FIG. 7 shows a cross section view of a MOSFET illustrating various layers of a multi-layer gate structure, in accordance with an embodiment of the invention. Well region 704 and trench 700 are formed in a semiconductor region using conventional techniques. The semiconductor region includes a n-type silicon region 702 over a n+ substrate 701. Silicon region 702 may be an epitaxial layer formed over the substrate using conventional techniques. Well region 704 extending in silicon region 702 is formed using known techniques. Trench 700 includes a gate dielectric layer 706 lining the trench sidewalls and bottom. A protective liner 703 lines the trench sidewalls and bottom over dielectric layer 706. Liner 703 may be from any material that protects dielectric layer 706 during formation of the various layers in trench 700. Liner 703 may be a dielectric layer or a conductive layer such as polysilicon, hafnium nitride (HfN), tantalum nitride (TaN) or titanium nitride (TiN). In one embodiment, liner 703 is formed using chemical mechanical polish (CMP). If a dielectric layer is used as liner 703, steps need to be taken to ensure that the transistor threshold voltage is not adversely impacted. For example, threshold adjust implant can be used to compensate for the presence of liner 703. A seed layer 708 and its overlying low resistance layer 710 are formed using one of the above-described techniques for forming these two layers.

A barrier layer 712, a second low resistance layer 714, and a cap layer 718 are sequentially formed over the first low resistance layer 710, as shown. In one embodiment, barrier layer 712 comprises titanium nitride and serves to prevent the two layers between which it lies from reacting together thus keeping their resistance low. A titanium nitride barrier layer 712 would also serve as an adhesion layer between layers 710 and 714. In another embodiment, the second low resistance layer 714 is eliminated so that cap layer is in contact with barrier layer 712. Cap layer 718 is from a highly conductive material to reduce the gate resistance. In one embodiment, cap layer 718 comprises one or more of tungsten, tantalum and molybdenum. In another embodiment, cap layer 718 comprises one or more salicidable material such as titanium (Ti), cobalt (Co), and Nickel (Ni).

Cap layer 718 also protects the underlying layers of the gate structures from contaminants during processing, and serves to contain the dopants in the underlying layers. In one embodiment, cap layer 718 comprises titanium silicide thus improving the temperature stability of the device (e.g., allow higher temperature processing). While the gate structure in FIG. 7 includes a number of layers, depending on the design goals and performance targets, fewer layers or other combinations of layers may be used. Source regions 716 extend in well regions 704, dielectric cap 720 extends over trench 700 and overlaps source regions 716, and source interconnect layer 722 extends over dielectric cap 720 and contacts source regions 716 and well region 704.

Figure 8:
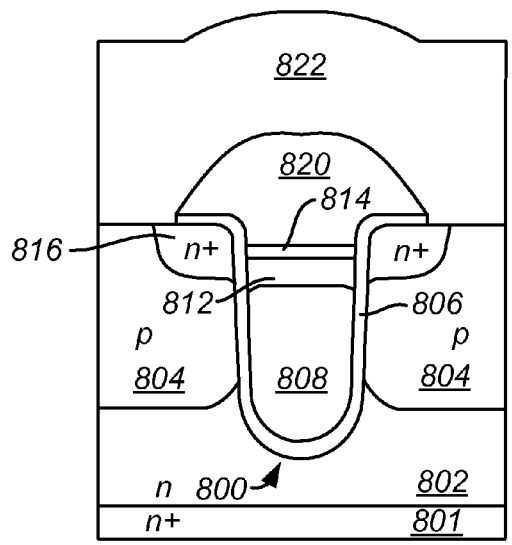
Figure 9:
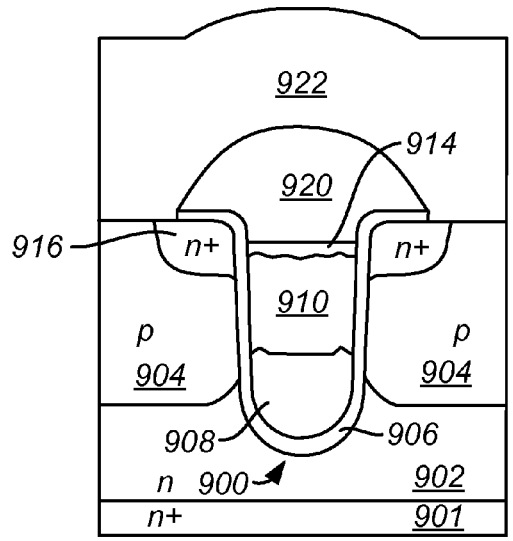

FIGS. 8-11 are cross section views depicting four of a number of possible variations of the gate structure in accordance with embodiments of the invention. In FIG. 8, well region 804, trench 800 and dielectric layer 806 lining the trench sidewalls and bottom and extending over the adjacent mesa surfaces are formed in a semiconductor region using conventional techniques. The semiconductor region includes a n-type silicon region 802 over a n+ substrate 801. Silicon region 802 may be an epitaxial layer formed over the substrate using conventional techniques. Well region 804 extending in silicon region 802 is formed using known techniques. Source regions 816 extend in well regions 804, dielectric cap 820 extends over trench 800 and overlaps source regions 816, and source interconnect layer 822 extends over dielectric cap 820 and contacts source regions 816 and well region 804. In FIG. 8, the gate structure comprises three layers of, from bottom to top, a recessed conductive seed layer 808 (e.g., comprising doped polysilicon), a low resistance runner layer 812 (e.g., comprising titanium silicide), and a cap layer 814 (e.g., comprising titanium nitride). As shown, seed layer 808 forms a larger portion of the gate structure. In one embodiment, seed layer 808 forms about 70-85% of the total gate structure. In FIG. 9, well region 904, trench 900 and dielectric layer 906 lining the trench sidewalls and bottom and extending over the adjacent mesa surfaces are formed in a semiconductor region using conventional techniques. The semiconductor region includes a n-type silicon region 902 over a n+ substrate 901. Silicon region 902 may be an epitaxial layer formed over the substrate using conventional techniques. Well region 904 extending in silicon region 902 is formed using known techniques. Source regions 916 extend in well regions 904, dielectric cap 920 extends over trench 900 and overlaps source regions 916, and source interconnect layer 922 extends over dielectric cap 920 and contacts source regions 916 and well region 904. In FIG. 9, the gate structure comprises three layers of, from bottom to top, a seed layer 908, a layer of low resistance material 910, and a cap layer 914. In this embodiment, seed layer 908 forms about 20-50% of the total gate structure and the layer of low resistance material 910 forms 30-70% of the total gate structure.

Figure 10:
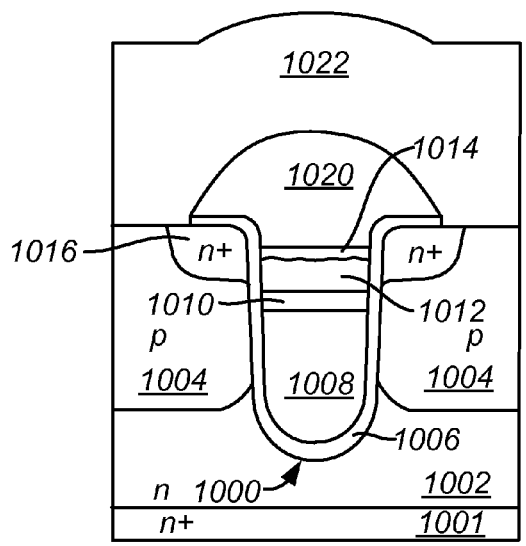

In FIG. 10, well region 1004, trench 1000 and dielectric layer 1006 lining the trench sidewalls and bottom and extending over the adjacent mesa surfaces are formed in a semiconductor region using conventional techniques. The semiconductor region includes a n-type silicon region 1002 over a n+ substrate 1001. Silicon region 1002 may be an epitaxial layer formed over the substrate using conventional techniques. Well region 1004 extending in silicon region 1002 is formed using known techniques. Source regions 1016 extend in well regions 1004, dielectric cap 1020 extends over trench 1000 and overlaps source regions 1016, and source interconnect layer 1022 extends over dielectric cap 1020 and contacts source regions 1016 and well region 1004. In FIG. 10, the gate structure comprises four layers of, from bottom to top, a recessed seed layer 1008 (e.g., comprising doped polysilicon), a barrier layer 1010 (e.g., comprising titanium silicide), a low resistance runner layer 1012 (e.g., comprising titanium silicide), and a cap layer 1014 (e.g., comprising titanium nitride). In one embodiment, the layer of low resistance material 1012 comprises tungsten (W) and cap layer 718 is eliminated since tungsten layer 1012 also serves the function of a cap layer.

Figure 11:
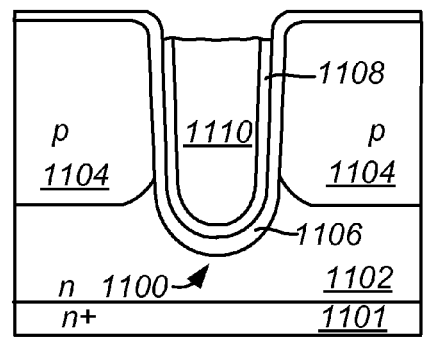

FIG. 11 shows a cross section view at an intermediate stage of the manufacturing process for forming a trench gate FET, in accordance with another embodiment of the invention. Well region 1104, trench 1100 and gate dielectric layer 1106 lining the trench sidewalls and bottom and extending over the adjacent mesa surfaces are formed in a semiconductor region using conventional techniques. The semiconductor region includes a n-type silicon region 1102 over a n+ substrate 1101. Silicon region 1102 may be an epitaxial layer formed over the substrate using conventional techniques. Well region 1104 extending in silicon region 1102 is formed using known techniques. In FIG. 11, conductive liner 1108 lining gate dielectric layer 1106 serves as a seed layer. Conductive liner 1108 may comprise one or more of hafnium nitride (HfN), tantalum nitride (TaN) or titanium nitride (TiN). A low resistance material 1110 is then formed using any one of the selective deposition techniques referenced above. This embodiment is advantageous in that the low resistance material 1110 is grown from three directions (i.e., from bottom and along trench sidewalls).

In an alternative variation of the FIG. 11 technique, a seed layer comprising polysilicon is formed in two steps. A first portion of the seed layer is formed filling a bottom portion of the trench in a similar manner to seed layer 108 in FIG. 1C. Vertically extending portions of the seed layer, referred to herein after as "seed liners", are then formed lining the trench sidewalls. The seed liners can be formed by first forming a polysilicon layer over the first portion of the seed layer and then etching the formed polysilicon layer using a directional etch such that the trench sidewalls remain covered by a thin layer of polysilicon while the reminder of the polysilicon is removed down to the first portion of the seed layer. Then, a low resistance material is formed in the trench using any one of the selective deposition techniques referenced above. The low resistance material is advantageously grown from three sides. The seed liners also serve to protect the gate dielectric layer. An alternate technique may be used whereby the first portion of the seed at the trench bottom and the seed liner portions are consumed upon forming the low resistance material.

The various layers in each of trenches 700, 800, 900, 1000 and 1100 in respective FIGS. 7, 8, 9, 10 and 11 may be formed using the processing methods described above in connection with the various embodiments, and may comprise any of the materials set forth above in connection with the various embodiments. Also, as in the previous embodiments, the techniques depicted by FIGS. 7-10 may be implemented in other types of power devices such as shielded gate MOSFETs and IGBTs.

Figure 12A:
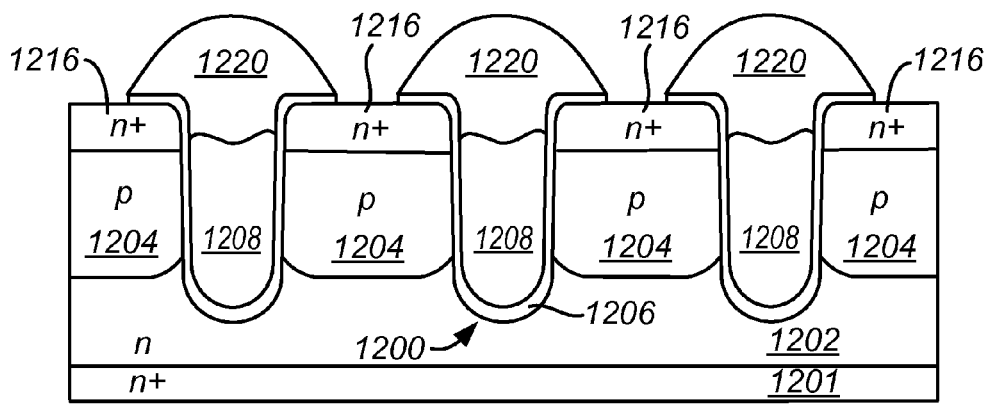
FIGS. 12A-12C are simplified cross section views depicting a process sequence for filling high aspect ratio contact openings, in accordance with an embodiment of the invention.
Figure 12B:
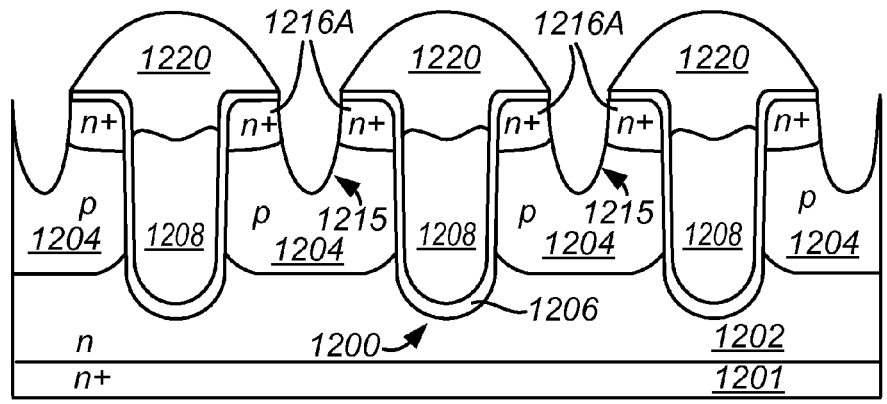
Figure 12C:
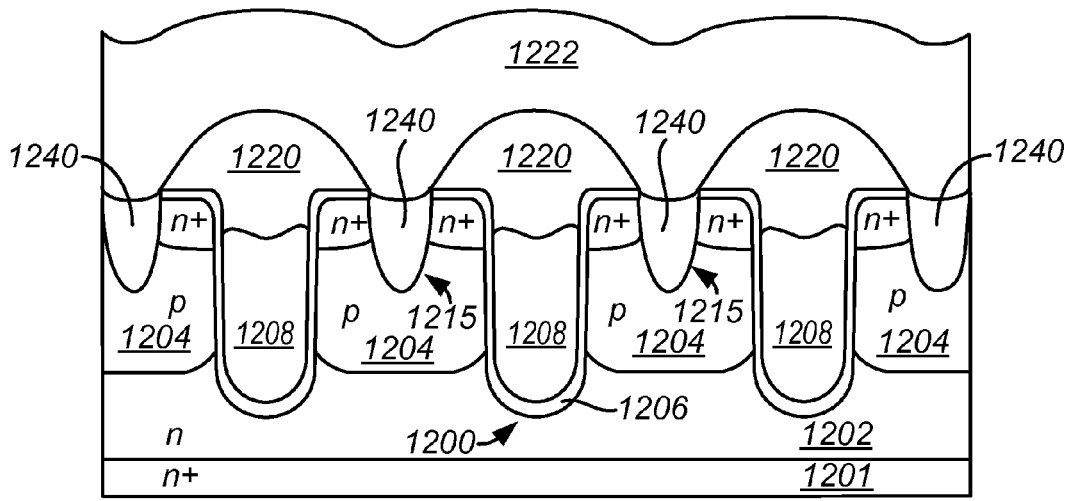

FIGS. 12A-12C are cross section views depicting a process sequence for filling source contact openings in a MOSFET, in accordance with an embodiment of the invention. The technique shown in FIG. 12A-12C is particularly useful in designs where contact openings (e.g., source contact opening in MOSFET) have a high aspect ratio. In FIG. 12A, well region 1204, n+ regions 1216, trenches 1200, gate dielectric layer 1206, recessed gates 1208, and dielectric cap 1220 are all formed in a semiconductor region using conventional techniques. The semiconductor region includes a n-type silicon region 1202 over a n+ substrate 1201. Silicon region 1202 may be an epitaxial layer formed over the substrate using conventional techniques. Well region 1204 extending in silicon region 1202 is formed using known techniques.

In FIG. 12B, exposed silicon surfaces between adjacent dielectric caps 1220 are recessed using conventional silicon etch techniques, thus forming source regions 1216A. Silicon capabilities and would enable process optimization of the various techniques described herein.

The table below shows electrical properties of various candidates for the low resistance material in the above-described embodiments, and the corresponding equivalent series resistance (ESR) improvement. Depending on the design goals and performance targets, one or a combination of these materials may be used as the low resistance material in the various embodiments disclosed herein.

| Material | Resistivity (ohm-cm) | Work Function (eV) | Thermal Stability/GOI | Melting Point | % ESR Improvement | % ESR Improvement at 50% Low resistance material |
|---|---|---|---|---|---|---|
| Poly-Silicon ($3 \times 10^{20}/cm^3$) N-type | 5E−04 | 4.35 | 1150° C. | 1412° C. | NA | NA |
| SiGe ($2 \times 10^{18}/cm^3$) | 12E−03 | — | 1000° C. | — | NA | NA |
| W | 5.65E−06 | 4.52 | >1050° C. | 3400° C. | 99 | 98 |
| Ta | 12.45E−06 | 4.19 | NA | 2980° C. | 98 | 95 |
| Ti | 42E−06 | ~4 | NA | 1667° C. | 92 | 85 |
| Cu | 1.67E−06 | — | NA | 1084° C. | 100 | 99 |
| Al | 2.65E−06 | 4.08 | ~500° C. | 660° C. | 99 | 90 |
| TiSi2 (C49/C54) | 60-70E−06/ 13-25E−06 | 3.95-4.18 | 900° C. | 1540° C. | 88/97 | 75/90 |
| WSi2 | 30-70E−06 | 4.62-6 | >1050° C. | 2165° C. | 94 | 89 |
| TaSi2 | 35-60E−06 | 4.71 | >1050° C. | 2200° C. | 93 | 87 |
| MoSi2 | 40-100E−06 | 4.72-6 | >1050° C. | 2030° C. | 92 | 85 |
| PtSi | 28-40E−06 | — | NA | 1229° C. | 94 | 89 |
| CoSi2 | 10-18E−06 | — | 900° C. | 1326° C. | 98 | 93 | recesses 1215 are thus formed in the mesa between adjacent trenches. As depicted in FIG. 12B, deeper silicon recesses are preferred because a greater surface area of well region 1204 is made available for contact purposes. Also a deeper source contact recess helps achieve a more robust UIS (unclamped inductive switching) performance since it results in a deeper body contact. But, deeper recesses are generally more difficult to fill. However, the technique depicted by FIGS. 12A-12C is a simple technique which can be used to fill very high aspect ratio recesses reliably. The exposed silicon surfaces in silicon recesses 1215 serve as the seed layer for selective deposition of a low resistance material 1240. Low resistance material 1240 may comprise any one or more of the known aluminum and/or silicides referenced above. A top-side source metal 1222 is then formed over the structure electrically contacting low resistance material 1240 as shown in FIG. 12C. Because the low resistance material grows inside silicon recesses 1215 from bottom up and from the sides inward, the resulting contact fill is a highly reliable and low resistance contact fill. This technique can be used in filling any high aspect ratio feature.

The technique in FIGS. 12A-12C allows use of a more neutral material (i.e., not heavily doped) as the low resistance material 1240 thus enabling contact to both P-type and N-type silicon. This is in contrast to polysilicon or strain silicon (such as Si—Ge), which if used for the source contact fill need to be heavily doped. Often, the type of dopant that can be used is restricted as well. In one embodiment, in FIG. 12B after forming recesses 1215 but before growing low resistance material 1240, a heavy body implant is carried out to form P+ heavy body regions in well regions 1204 through recesses 1215.

Source contact aspect ratio continues to increase. The selective growth of low resistance material over a seed layer, in accordance with the present invention, allows for an excellent fill for the source contact with metal and/or silicides. Addition of enablers such as CMP can further add to the The improvements in ESR due to low resistance gate material would be more pronounced in devices and technologies with smaller gate cross-sectional area where the gate resistance is higher. The baseline used in the above calculations was N-type polysilicon at $3 \times 10^{20}/cm^3$ dopant concentration, and the following assumptions were made for the ESR improvement calculation. First, that ESR is dominated by gate resistance. Second, all the gate material is replaced, which may not be true for all the different gate stack combinations described above. Third, fifty percent of the gate area is filled with low resistance material.

In accordance with the present invention, the well known principle of selective deposition of low resistance materials such as refractory metals and their silicides, is used in combination with new techniques for forming a seed layer at the bottom of trenches or in high aspect ratio contact openings to reduce gate resistance and/or source resistance. Significant improvements in gate ESR (up to about 95%) can be achieved compared to conventional salicide processes. This is possible due to the increased thickness of the low resistance material made possible by the processes disclosed herein. The low gate resistance allows cell pitch reduction, resulting in significant improvements in the on resistance Rdson. In one embodiment, the potential for attack on a large area of the gate dielectric by the low resistance material is significantly reduced by using pre-reacted silicide rather than pure metal. This risk can be further reduced by using liners and spacers.

The various techniques disclosed herein require simple process in terms of integrating silicide layers with existing process flows. The materials used in the gate structure can be defined by the function such as, liner (metal or silicide gate), barrier (TiSi2 barrier or metal runner such as W), cap material (impurity and dopant out-diffusion), low resistivity gate material, seed material, and adhesion layer. These various layers may be combined in a number of different ways depending on the design goals. For example, a tungsten cap layer may be formed on top of polysilicon with $TiSi_2$ as a barrier to the tungsten siliciding with the polysilicon.

The various process flows described herein are highly flexible in terms of the choice of low resistivity material and the gate material stack. Materials may include metals and metal silicides such as Al, W, $WSi_2$, $TiSi_2$ and potentially other refractory metals and their silicides (M-Si, M-Pt, Mo, Ta, Co, Ni). A dummy gate can be used when using a low melting point material such as aluminum. Also, a variety of materials and combinations, such as tungsten cap layer on top of polysilicon with $TiSi_2$ as a barrier layer preventing the tungsten from siliciding with polysilicon, are possible.

Further, improved temperature stability is achieved as refractory materials such as W and their silicides are used. Also, capping an existing layer of $TiSi_2$ for improving its thermal stability is possible. By properly selecting the type of silicide used, it is now possible to overcome any limitations due to critical dimension (CD) of the gate, along with the thermal stability.

A number of variations in terms of the amount of trench filled with polysilicon versus the low resistivity material are possible, including using almost no polysilicon to using all polysilicon with or without a capping material in high aspect ratio trenches.

The selective deposition process used in the various processes described herein fills the trench or source contact opening from bottom up and therefore fills effectively and consistently in spite of trench or source width variation. This variation center-edge may be caused during etch. By filling varying trenches from bottom up, this process minimizes reliability issues related to lack of good fill center to edge. Uniformity within the wafer, reliability and process consistency are thus improved.

While the various figures depicting particular process sequences show various layers/regions of the MOSFET being formed in a particular sequence, the invention is not limited as such. For example, the well region and source regions in the above embodiments may be formed at later or earlier stages of the process.

The various techniques described herein are not limited to the particular trench MOSFETs shown, but may be integrated directly or in modified form with other trench gate structures, trench structures with electrodes or silicon material therein, or shielded gate structures such as those shown in the above-referenced patent application Ser. No. 11/026,276, which disclosure is incorporate herein by reference in its entirety. Examples of devices in the above-referenced application with which the techniques of the present invention may be advantageously integrated can be found in FIGS. 1, 2A-2B, 3A-3B, 4A-4E, 6-8, 10-12, 14-20 and 26A-26C.

While the above provides a detailed description of various embodiments of the invention, many alternatives, modifications, and equivalents are possible. Also, it is to be understood that all numerical examples and material types provided herein to describe various dimensions, energy levels, doping concentrations, and different semiconducting or insulating layers are for illustrative purposes only and not intended to be limiting. For this and other reasons, therefore, the above description should not be taken as limiting the scope of the invention.

What is claimed is:

1. A method of forming a trench gate field effect transistor, the method comprising:
   forming a trench in a silicon region;
   forming a dielectric layer lining a sidewall of the trench and a bottom surface of the trench;
   forming a first polysilicon layer on the bottom surface of the trench;
   forming a first conductive material layer on an exposed surface of the first polysilicon layer;
   forming a second polysilicon layer on an exposed surface of the first conductive material layer; and
   performing rapid thermal processing to cause the first polysilicon layer, the second polysilicon layer and the first conductive material layer to react.

2. The method of claim 1 further comprising:
   prior to performing the rapid thermal processing:
      forming a second conductive material layer on an exposed surface of the second polysilicon layer, the performing the rapid thermal processing further causes the second polysilicon layer and the second conductive material layer to react.

3. The method of claim 1 wherein the first conductive material layer includes at least one of tungsten, tantalum and molybdenum.

4. The method of claim 1 wherein forming the first conductive material layer includes depositing the first conductive material layer using directional deposition.

5. The method of claim 1 wherein the silicon region includes a substrate of a first conductivity type, the method further comprising:
   forming an epitaxial layer of the first conductivity type over the substrate, the epitaxial layer having a lower doping concentration than the substrate, the epitaxial layer forming an upper portion of the silicon region;
   forming a well region of a second conductivity type in the epitaxial layer; and
   forming a source region of the first conductivity type in the well region and adjacent to the trench.

6. A method of forming a trench gate field effect transistor, the method comprising:
   forming a trench in a silicon region;
   forming a dielectric layer lining a sidewall of the trench and a bottom surface of the trench;
   forming a polysilicon layer on the bottom surface of the trench;
   forming a conductive material layer, the conductive material layer having a vertically extending portion on at least a portion of the dielectric layer lining the sidewall of the trench and a horizontally extending portion on an exposed surface of the polysilicon layer;
   removing the vertically extending portion of the conductive material layer while at least part of the horizontally extending portion of the conductive material remains,
   performing rapid thermal processing to cause the polysilicon layer and the conductive material layer to react.

7. The method of claim 6 wherein removing the vertically extending portions of the conductive material layer includes isotropically etching the conductive material layer.

8. The method of claim 6 wherein the conductive material layer includes a salicidable material.

9. The method of claim 6 wherein performing the rapid thermal processing causes a portion of the conductive material layer in contact with the polysilicon layer to react with the polysilicon layer, the method further comprising:
   removing un-reacted portions of the conductive material layer using a selective etch.

10. The method of claim 9 wherein the rapid thermal processing is a first rapid thermal processing, the method further comprising:
    after removing the un-reacted portions, performing a second rapid thermal processing to cause the reacted portion of the conductive material layer to change phase.

11. The method of claim 6 further comprising:
forming a protective layer in the trench on an exposed surface of the horizontally extending portion of the conductive material layer that is extending over the polysilicon layer; and
etching the conductive material layer to remove unprotected portions of the conductive material layer extending over surfaces of the silicon region, the unprotected portions not being covered by the protective layer.

12. A method of forming a shielded gate field effect transistor in a silicon trench, comprising:
lining at least a lower portion of a sidewall of the trench and a bottom surface of the trench with a shield dielectric;
depositing a shield electrode in at least a portion of the lower portion of the trench;
forming an inter-electrode dielectric on an exposed surface of the shield electrode;
forming a dielectric layer lining at least an upper portion of the sidewall of the trench and extending over a surface of a silicon region adjacent to the trench;
forming a polysilicon layer in the trench on an exposed surface of the inter-electrode dielectric;
forming a conductive material layer, the conductive material layer having a vertically extending portion on at least a portion of the dielectric layer lining the sidewall of the trench and a horizontally extending portion on an exposed surface of the polysilicon layer; and
performing rapid thermal processing to cause the polysilicon layer and the conductive material layer to react.

13. The method of claim 12 further comprising:
forming a protective layer on an exposed surface of the conductive material layer, the protective layer serving to prevent dopants in at least one underlying layer from diffusing out.

14. The method of claim 12 wherein the conductive material layer includes at least one of tungsten, tantalum and Moly (Mo).

15. The method of claim 12 wherein forming the conductive material layer includes depositing the conductive material layer using directional deposition.

16. The method of claim 12 further comprising:
prior to performing rapid thermal processing, removing the vertically extending portion of the conductive material layer while at least part of the horizontally extending portion of the conductive material layer remains;
forming a protective layer in the trench on an exposed surface of the horizontally extending portion of the conductive material layer on the polysilicon layer; and
etching the conductive material layer to remove unprotected portions of the conductive material layer extending over a surfaces of the silicon region, the unprotected portions not being covered by the protective layer.

17. The method of claim 16 wherein removing the vertically extending portions includes isotropically etching the conductive material layer.

18. The method of claim 16 wherein the protective layer includes at least one of polysilicon and BPSG.

19. The method of claim 12 wherein the conductive material layer includes a salicidable material.

20. The method of claim 12 wherein the rapid thermal processing causes a portion of the conductive material layer in contact with the polysilicon layer to react with the polysilicon, the method further comprising:
removing un-reacted portions of the conductive material layer using a selective etch.

21. The method of claim 20 wherein the rapid thermal processing is a first rapid thermal processing, the method further comprising:
after removing the un-reacted portions, performing a second rapid thermal processing to cause the reacted portion of the conductive material layer to change phase.

22. The method of claim 12 wherein the silicon region includes a substrate of a first conductivity type, the method further comprising:
forming an epitaxial layer of the first conductivity type over the substrate, the epitaxial layer having a lower doping concentration than the substrate, the epitaxial layer forming an upper portion of the silicon region;
forming a well region of a second conductivity type in the epitaxial layer; and
forming a source region of the first conductivity type in the well region and adjacent to the trench.

23. A method of forming a trench gate field effect transistor, the method comprising:
forming a trench in a silicon region;
forming a dielectric layer lining a sidewall of the trench and a bottom surface of the trench;
forming a polysilicon layer on the bottom surface of the trench;
forming a conductive material layer on an exposed surface of the polysilicon layer;
performing rapid thermal processing to cause the polysilicon layer and the conductive material layer to react;
forming a protective layer in the trench on an exposed surface of a horizontally extending portion of the conductive material layer that is extending over the polysilicon layer; and
etching the conductive material layer to remove unprotected portions of the conductive material layer extending over surfaces of the silicon region, the unprotected portions not being covered by the protective layer.

24. The method of claim 23 wherein the protective layer includes at least one of polysilicon and BPSG.

25. The method of claim 23 wherein the conductive material layer includes a salicidable material.

* * * * *

UNITED STATES PATENT AND TRADEMARK OFFICE
CERTIFICATE OF CORRECTION

PATENT NO.       : 8,592,277 B2
APPLICATION NO.  : 12/891147
DATED            : November 26, 2013
INVENTOR(S)      : Sreevatsa Sreekantham et al.

It is certified that error appears in the above-identified patent and that said Letters Patent is hereby corrected as shown below:

In the claims

In column 17, line 52, in claim 16, delete "surfaces" and insert -- surface --, therefor.

Signed and Sealed this
First Day of April, 2014

Michelle K. Lee
*Deputy Director of the United States Patent and Trademark Office*